US011804790B2

(12) United States Patent
Magnusson et al.

(10) Patent No.: US 11,804,790 B2
(45) Date of Patent: Oct. 31, 2023

(54) PIEZOELECTRIC MOTOR

(71) Applicant: Taurus Technologies Holdings Inc., Barrington, IL (US)

(72) Inventors: Marta Magnusson, Grimsby (CA); Stefan Magnusson, Grimsby (CA)

(73) Assignee: TAURUS TECHNOLOGIES HOLDINGS, INC., Barrington, IL (US)

( * ) Notice: Subject to any disclaimer, the term of this patent is extended or adjusted under 35 U.S.C. 154(b) by 371 days.

(21) Appl. No.: 16/941,477

(22) Filed: Jul. 28, 2020

(65) Prior Publication Data

US 2022/0038033 A1 Feb. 3, 2022

(51) Int. Cl.

*H02N 2/10* (2006.01)
*H02N 2/18* (2006.01)
*H02K 1/12* (2006.01)
*H02K 1/27* (2022.01)
*H10N 30/40* (2023.01)

(52) U.S. Cl.

CPC ............... *H02N 2/101* (2013.01); *H02K 1/12* (2013.01); *H02K 1/27* (2013.01); *H02N 2/18* (2013.01); *H10N 30/40* (2023.02)

(58) Field of Classification Search

CPC ........... H01L 41/107; H02N 2/18; H02N 2/10
See application file for complete search history.

(56) References Cited

U.S. PATENT DOCUMENTS

| | | | | |
|---|---|---|---|---|
| 2011/0278990 | A1* | 11/2011 | Knowles | F03B 13/14 29/25.35 |
| 2016/0305493 | A1* | 10/2016 | Klassen | F16D 13/64 |
| 2017/0179367 | A1* | 6/2017 | Kijima | H02K 1/27 |
| 2017/0373244 | A1* | 12/2017 | Yabuta | H04N 23/55 |
| 2018/0114894 | A1* | 4/2018 | Peters | H02N 2/18 |

FOREIGN PATENT DOCUMENTS

| | | |
|---|---|---|
| CN | 103973161 A | 8/2014 |
| CN | 110601596 A | 12/2019 |

OTHER PUBLICATIONS

Examiner's Report dated May 3, 2022, issued to corresponding Canadian Application No. 3,148,701.

* cited by examiner

*Primary Examiner* — Bryan P Gordon
(74) *Attorney, Agent, or Firm* — Stein IP, LLC

(57) ABSTRACT

A brushless electric motor is disclosed. A group of permanent magnets are physically attached to a group of piezoelectric actuators which push them toward or pull them away from a second group of permanent magnets when the piezoelectric actuators are electrically activated. The second group of permanent magnets may also be pushed and pulled with a second group of piezoelectric actuators. Alternate configurations using electromagnets are also disclosed. A novel configuration for the groups of electromagnets which maximizes efficiency in a piezoelectrically actuated motor is also disclosed.

14 Claims, 11 Drawing Sheets

10 11 12 13 14 15 15a 15b 16 16a 16b 17 17a 17b 18 19

PIEZOELECTRIC MOTOR

This invention relates to a new type of brushless electric motor which uses piezoelectric elements to push permanent or electromagnets together or pull them apart to create rotational force, delivering high amounts of torque with high efficiency. Novel configurations of permanent magnets allow the motor assembly to deliver large amounts of torque while remaining stable at load and over long operating times.

BACKGROUND OF THE INVENTION

The present invention relates to brushless electric motors. Electric motors are well-known in the art: the "brushless" type of electric motor dates from the latter half of the 20th Century and uses solid-state electronics to replace the physical commutator (polarity reversal switch) that allowed brush-type electric motors to function. Both types of electric motor use electromagnets which periodically have their polarity reversed so that they alternately push and pull (or, depending on the type of motor, only do one or the other) on a rotating magnetic element (called a rotor) while themselves remaining in a fixed position relative to the rotator (the elements which do not move referred to as a stator.)

While brushless motors were a large improvement in many ways, as they have less frictional load and fewer mechanical parts, they have many inefficiencies. Constantly reversing the electromagnets causes electrical inefficiencies, and the windings of the electromagnets can suffer fatigue and/or heat breakdown which causes the motor to become inefficient or stop functioning. While brushless motors are typically more than 50% efficient in terms of mechanical energy out compared to electrical energy in, they do suffer from loss of energy due to various factors such as wire heating, resistance, et cetera. Brushless motors require intricately wound electromagnetic rotor and/or stator magnets which are expensive and inefficient to construct. Electromagnets are also fairly heavy and contribute to parasitic load and/or weight inefficiency.

A brushless electric motor which did not use electromagnets and therefore was more efficient and more economical to build would be a useful invention.

A brushless electric motor which did not use electromagnets and was therefore more efficient and economical to power would be a useful invention. A brushless electric motor which did not use electromagnets and was therefore more durable and reliable would be a useful invention.

A brushless electric motor which did not use electromagnets and was therefore lighter than a motor of equivalent output which did use electromagnets would be a useful invention.

The present invention addresses these concerns.

SUMMARY OF THE INVENTION

Among the many objectives of the present invention is the provision of a brushless electric motor which uses piezoelectric impulse and permanent magnets as a source of generating mechanical energy from electrical energy.

Another objective of the present invention is the provision of a brushless electric motor which does not use electromagnets and is therefore more efficient and economical to construct.

Another objective of the present invention is the provision of a brushless electric motor which does not use electromagnets and is therefore more efficient and economical to operate.

Yet another objective of the present invention is the provision of a brushless electric motor which does not use electromagnets and is therefore more durable and easier to maintain.

Still another objective of the present invention of a brushless electric motor which does not use electromagnets and is therefore lighter in weight than a traditional brushless electric motor of equivalent output.

Other advantages and objectives of the present invention will become clear by reading the application and the disclosures herein.

DESCRIPTION OF THE PREFERRED EMBODIMENTS

Figure 1:
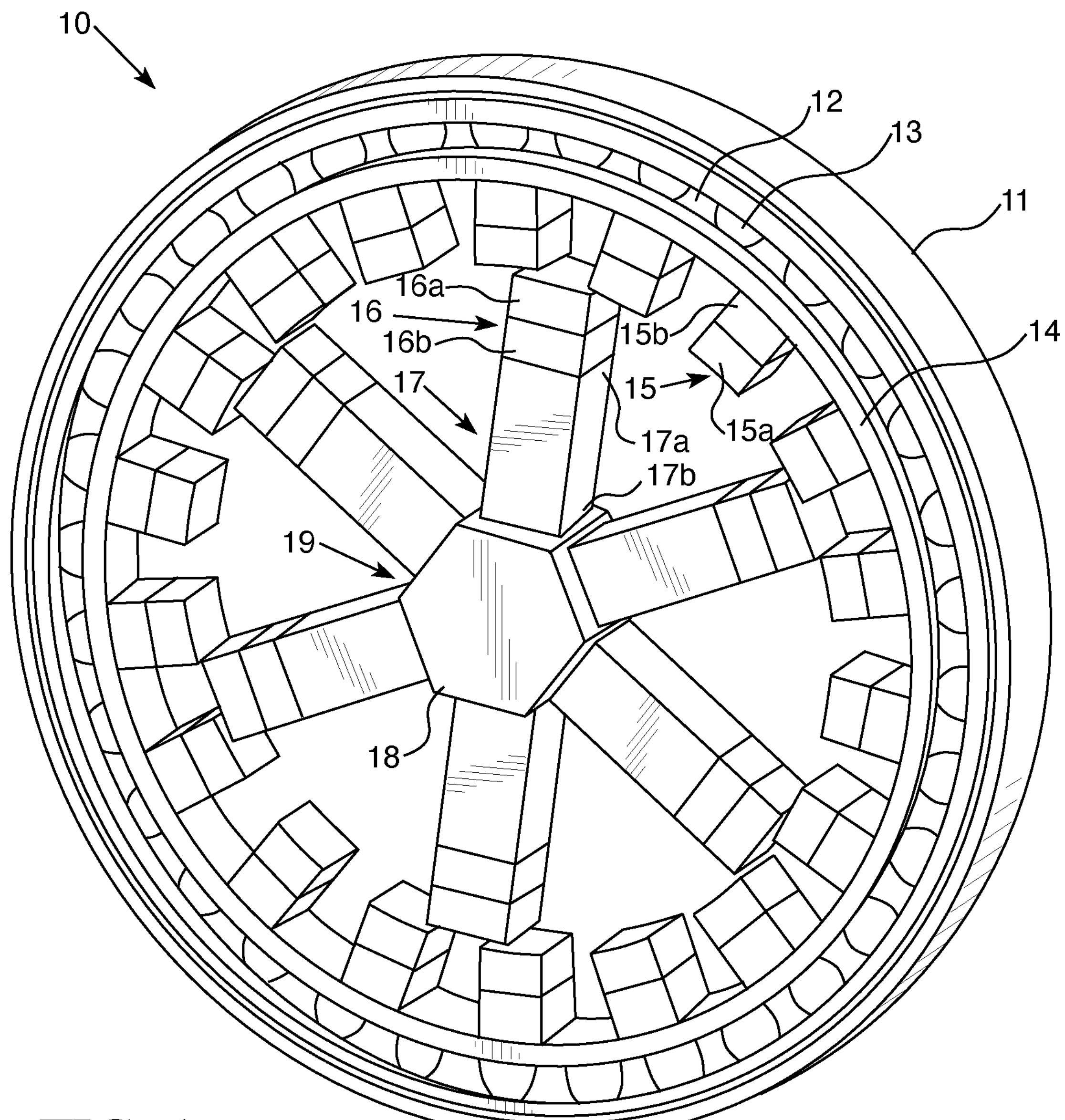
FIG. 1 depicts a perspective view of the brushless electric motor.

Reference will now be made in detail to several embodiments of the invention that are illustrated in accompanying drawings. Whenever possible, the same or similar reference numerals are used in the drawings and the description to refer to the same or like parts or steps. The drawings are in simplified form and are not to precise scale. For purposes of convenience and clarity only, directional terms such as top, bottom, left, right, up, down, over, above, below, beneath, rear, and front, can be used with respect to the drawings. These and similar directional terms are not to be construed to limit the scope of the invention in any manner. The words attach, connect, couple, and similar terms with their inflectional morphemes do not necessarily denote direct or intermediate connections, but can also include connections through mediate elements or devices.

It should be noted that the sizes and configurations of the preferred embodiment(s) described in the drawings are exaggerated for clarity of disclosure: in actual practice, the tolerances between the elements of embodiments of the invention would be much more precise. It is a feature of the invention that it allows such very precise tolerances.

For purposes of this invention, piezoelectric actuators are described as being "electrically connected" to a power supply. Such a connection can be made via physical conductors (wires, PCB conductive paths, conductive inks, et cetera) or by any other reasonable means that allows the power supply to supply energy to the piezoelectric actuators and causes the piezoelectric effect to change the dimensions of the piezoelectric actuators. This includes, but is not limited to, electromagnetic induction or transfer by capacitance. It is required that the means of electrical connection be able to switch the piezoelectric actuators on and off and/or apply a current flow in one direction and then in the other direction fast enough to allow the motor to operate, as will be made clear in the specification below. This will be referred to generally as "rise" time—the period of time it takes to energize the piezoelectric actuator and/or the capacitator powering it—and the "fall" time—the period of time it takes to deenergize the piezoelectric actuator and/or the capacitor powering it.

For purposes of this application, motors will generally have a group of components which remains static relative to a load, and a second group of components which will move relative to the first group of components. The first group of components will be referred to collectively as a stator assembly, and the second group referred to collectively as a rotor assembly. Prefixing a component with the word "rotor" or "stator" indicates which group of components it belongs to in the embodiment/configuration which is currently being described. Piezoelectric actuators in the stator assembly are stator piezoelectric actuators (or simply stator actuators) and magnets affixed to stator piezoelectric actuators are stator magnets, and vice versa with regard to the rotor assembly.

At the same time, for purposes of this application magnets can also be described as falling into one or both of two distinct types independent of whether they are part of the stator assembly or the rotor assembly. Actuator magnets are magnets which have/are having force imposed upon them by a piezoelectric actuator. Response magnets are magnets which have/are having force imposed upon them via magnetic field interactions with actuator magnets. If only one group of magnets is affixed to piezoelectric actuators, those are the actuator magnets, and the rest of the magnets in the motor are response magnets. If multiple groups of magnets are affixed to piezoelectric actuators, magnets affixed to a piezoelectric actuator which is being energized and causing it to impose force on those magnets are actuator magnets, and magnets which are not so affixed, or which are affixed to a piezoelectric actuator which is not being energized, are response magnets. It is possible for any given magnet to be an actuator magnet or a response magnet or both at any given time depending on the motor controller's configuration and energization of the piezoelectric actuators. A rotor magnet or a stator magnet may at any time be an actuator magnet, a response magnet, or both.

By referring to FIG. 1, the basic nature of the invention can be easily understood. FIG. 1 depicts a brushless electric motor 10. Outer rotor housing 11 surrounds bearing 12 which is free to rotate on balls 13, which bear the load between the motor and whatever it is mounted in and whatever it is driving. Inner rotor element 14 has multiple rotor magnets 15 having rotor north poles 15*a* and rotor south poles 15*b*. Any suitable magnet may be used for rotor magnets 15, including but not limited to rare-earth magnets, ferromagnets, and/or ceramic magnets containing ferromagnetic and/or rare-earth magnetic particles. Electromagnets may also be used. If electromagnets are used, it is optional, but neither preferred nor required, to allow them to reverse polarity as driven by a solid-state commutator of the type found in traditional brushless electric motors.

Stator assembly 19 consists of central hub 18, which supports multiple stator piezoelectric actuators 17. Stator piezoelectric actuators 17 have a magnet mount end 17*a* and a hub end 17*b*. Stator piezoelectric actuators 17 are connected to a switching power supply (not shown) which can energize the stator piezoelectric actuators at any reasonable driving frequency. When the stator piezoelectric actuators are energized, they expand, using the principle of piezoelectric expansion, also known as the piezoelectric effect, which is well known to persons of ordinary skill in the art. Stator piezoelectric actuators 17 are constructed so that their expansion is along their long axes: in other words, when the stator piezoelectric actuators are energized, the distance between magnet mount end 17*b* and hub end 17*a* increases.

Mounted to magnet mount ends 17*b* are stator magnets 16, having stator north poles 16*a* and stator south poles 6*b*. Any suitable magnet may be used for stator magnets 16, including but not limited to rare-earth magnets, ferromagnets, and/or ceramic magnets containing ferromagnetic and/or rare-earth magnetic particles. Electromagnets may also be used. If electromagnets are used, it is optional, but neither preferred nor required, to allow them to reverse polarity as driven by a solid-state commutator of the type found in traditional brushless electric motors.

It is strongly preferred that the rotor magnets and the stator magnets have the same poles (north and north or south and south) in opposition at their closest points (as shown) but with proper configuration, it is possible to practice the invention with the rotor magnets and the stator magnets having opposite poles (north and south or south and north) in opposition. If opposite poles are put into opposition, the motor may require an external initiating force and/or the stator piezoelectric actuators may be required to be energized in a staggered sequence. If reversible electromagnets are used for either the rotor magnets, the stator magnets, or both, the question of initial polarities is unimportant.

The preferred embodiment pictured in FIG. 1 shows the invention ready to be practiced. The magnetic forces from the rotor magnets and the stator magnets are at a point of equilibrium where the magnets are in the lowest possible potential energy state with regard to the magnetic repulsion between the rotor magnets and the stator magnets. Inner rotor element 14 will, absent the addition of energy from some exterior source, remain at this point of equilibrium indefinitely.

To practice the invention, stator piezoelectric actuators 17 are energized. This causes the distance between hub end 17*b* and magnet mount end 17*a* to increase, pushing stator magnet 16 closer to rotor magnet 15. This increases the magnetic repulsion between the rotor magnet and the stator magnet, disturbing the equilibrium between them. In the configuration shown, it may be necessary to impart a slight initial rotational force and/or to energize the stator piezoelectric actuators in sequence so as to asymmetrically disturb the equilibrium of magnetic forces and allow rotation to begin.

Once the equilibrium between the rotor magnets and the stator magnets is disturbed, the system will have more magnetic potential energy than before, which will cause the rotor magnets to exert a force on inner rotor 14. Inner rotor element 14 is free to rotate, so it will rotate in one direction or the other as impelled by the balance of forces. As will be shown in later figures, control of the shape and orientation of the rotor magnets and/or stator magnets will allow for a preferred direction of rotation.

The switching power supply is controlled by a frequency controller (not shown) which causes it to energize and de-energize stator piezoelectric actuators 17 at a frequency which will continue to convert magnetic potential energy into rotational energy and accelerate inner rotor element 14 in a rotational fashion. It is preferred, but not required, that sensors (not shown) be operably connected to the inner rotor element or otherwise be able to detect its angular velocity, and communicate it to the frequency controller such that the frequency controller can adjust the driving frequency to increase or decrease the force exerted by the stator magnets on the rotor magnets and thus either increase the speed of rotation (under constant load,) increase the applied torque (under increasing load,) or both.

If such sensors are used, the invention can also be used as an extremely precise stepper motor and/or rotational position sensor. It is preferred, but not required, that a sensor allowing absolute rotational position data also be incorporated into the invention if such a usage is desired. This allows the frequency controller to know where the inner rotor element is at the beginning and the end of a step cycle.

Although the preferred embodiment is described as a brushless electric motor, which is designed to convert electrical potential from a switching power supply into rotational energy, it will be apparent to persons of ordinary skill in the art that since the piezoelectric effect works both ways—electrical potential can be turned into mechanical force, and mechanical force can be turned into electrical potential—that the preferred embodiment can also serve as a generator of electrical power if an external load forces the inner rotor element to rotate against the magnetic force attempting to hold it in equilibrium. Similarly, the preferred embodiment can also be used as a drive motor which also provides regenerative braking by switching from power in (during drive mode) to power out (during regenerative braking mode.) All of the alternate configurations/embodiments/methods of practice described in this paragraph are applicable to all of the embodiments of the invention disclosed in this application.

Figure 2:
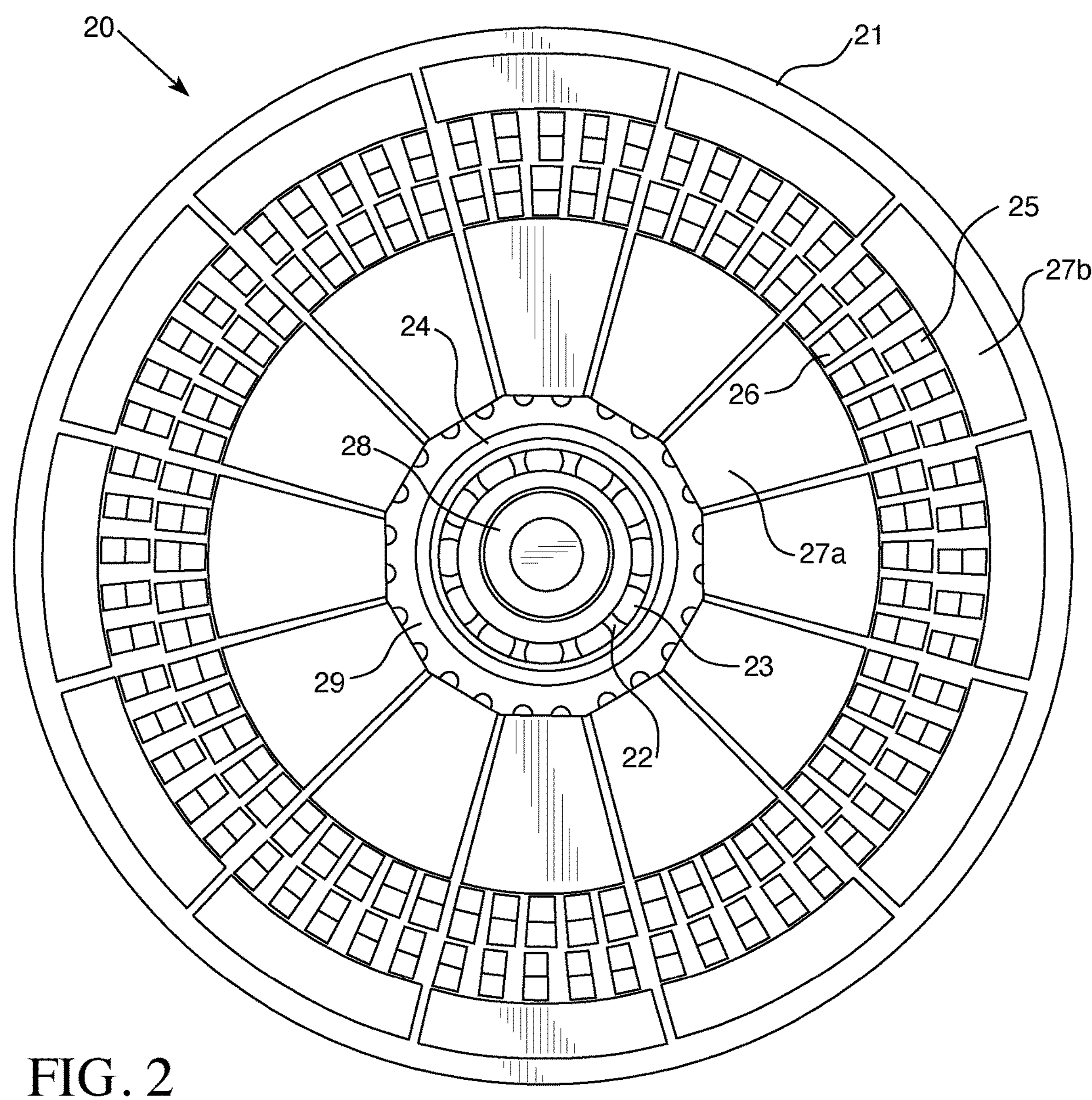
FIG. 2 depicts an overhead view of a first alternate embodiment of the brushless electric motor.

FIG. 2 shows a first alternate embodiment of the brushless electric motor. The first alternate embodiment of the brushless electric motor works in the same general fashion as the embodiment of FIG. 1, except where noted otherwise. It likewise would incorporate a switching power supply, frequency controller, and could incorporate sensors, et cetera.

Brushless electric motor 20 incorporates rotor piezoelectric actuators 27*b*, analogous to stator piezoelectric actuators 17 in FIG. 1. Brushless electric motor 20 also incorporates stator piezoelectric actuators 27*a*. It is neither preferred nor required for either configuration to be applied with a single (inner and outer) group of piezoelectric actuators or a double (inner and outer) group of piezoelectric actuators: the two configurations are shown for clarity of disclosure.

When either stator piezoelectric actuators 27*a* or rotor piezoelectric actuators 27*b* are energized, rotor magnets 25 are pushed toward stator magnets 26, and as in FIG. 1, magnetic repulsion is increased, incurring a force against the rotor piezoelectric actuators. As the rotor piezoelectric actuators are affixed to outer casing 21, which is free to rotate relative to hub 29 on bearing 52 (not identified, see FIG. 5) which includes race 22 containing balls 23, balls 23 bearing the load and allowing rotation of rotary center bearing element 24 relative to fixed center bearing element 28.

Depending on the desired method of operation, the stator piezoelectric actuators can be activated in concert with the rotor piezoelectric actuators, or only one or the other group of piezoelectric actuators can be active at any given time. Activating both at once can be used to increase torque/rotational velocity, whereas activating only one or the other can be used for lower output modes. Alternatively, one group of piezoelectric actuators can be wired to deliver input power (motor driving) and the other group wired to receive output power (generation/regenerative braking.) The groups of piezoelectric actuators can also be wired such that some of the actuators in each group are preferentially used to deliver input power and some are preferentially used to receive output power. Finally, all or fewer than all of the piezoelectric actuators in a particular group can be active at any given time to deliver any particular desired amount of input power or receive any particular desired amount of output power, allowing an additional means of controlling power flow and/or reducing electrical fatigue on the individual components as they are cycled in and out of service.

Figure 3:
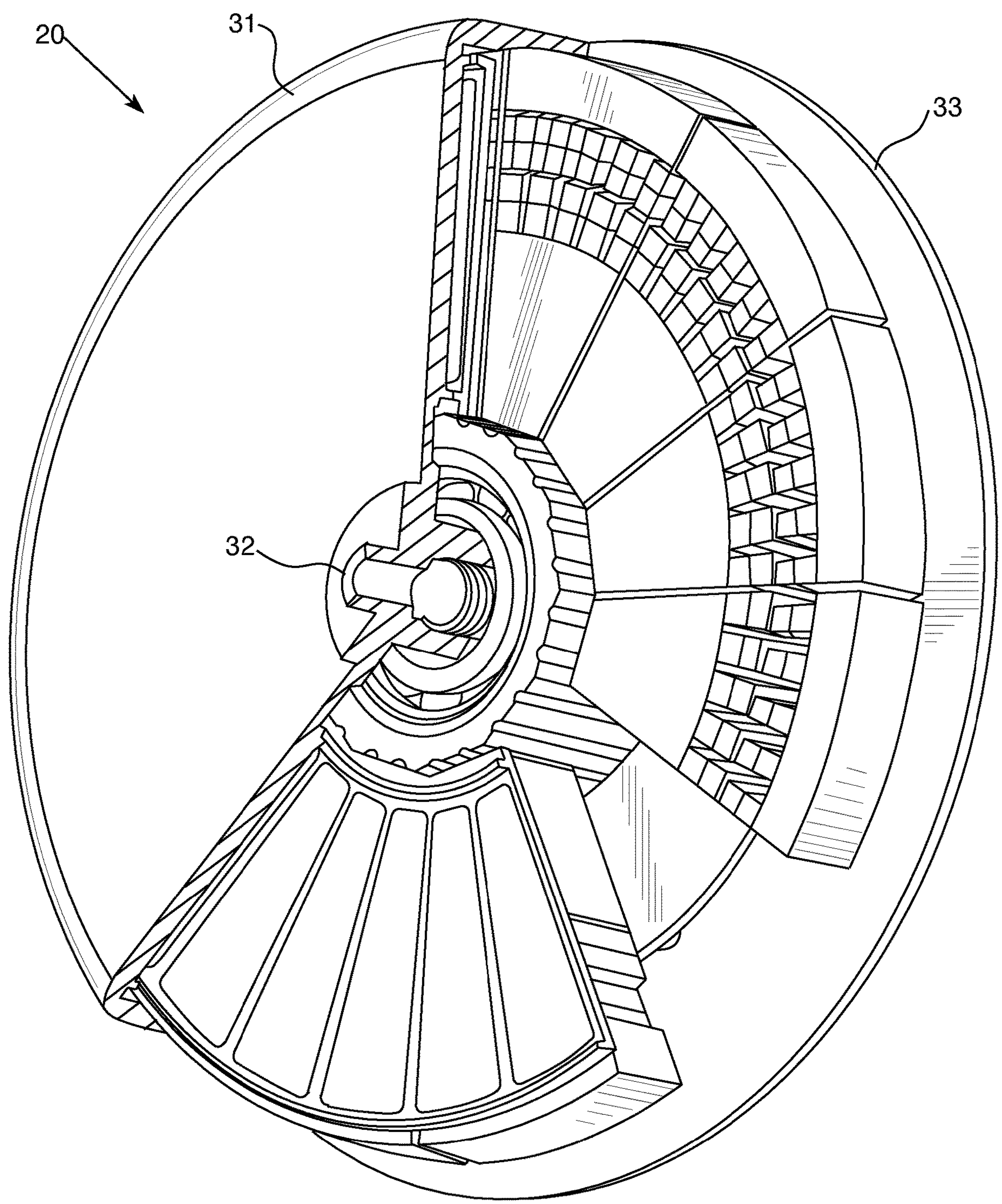
FIG. 3 depicts a cutaway perspective view of the first alternate embodiment of the brushless electric motor.

FIG. 3 shows the first alternate embodiment in cutaway form. Brushless electric motor 20, having the same components as in FIG. 2, is surrounded by backing plate 33 and housing 31, while hollow shaft 32, which is operably affixed to hub 29 (see FIG. 2) and/or rotary center bearing element 24, allows either delivery of mechanical rotational energy (motor mode) or input of mechanical rotational energy (generation/regenerative braking mode.)

Figure 4:
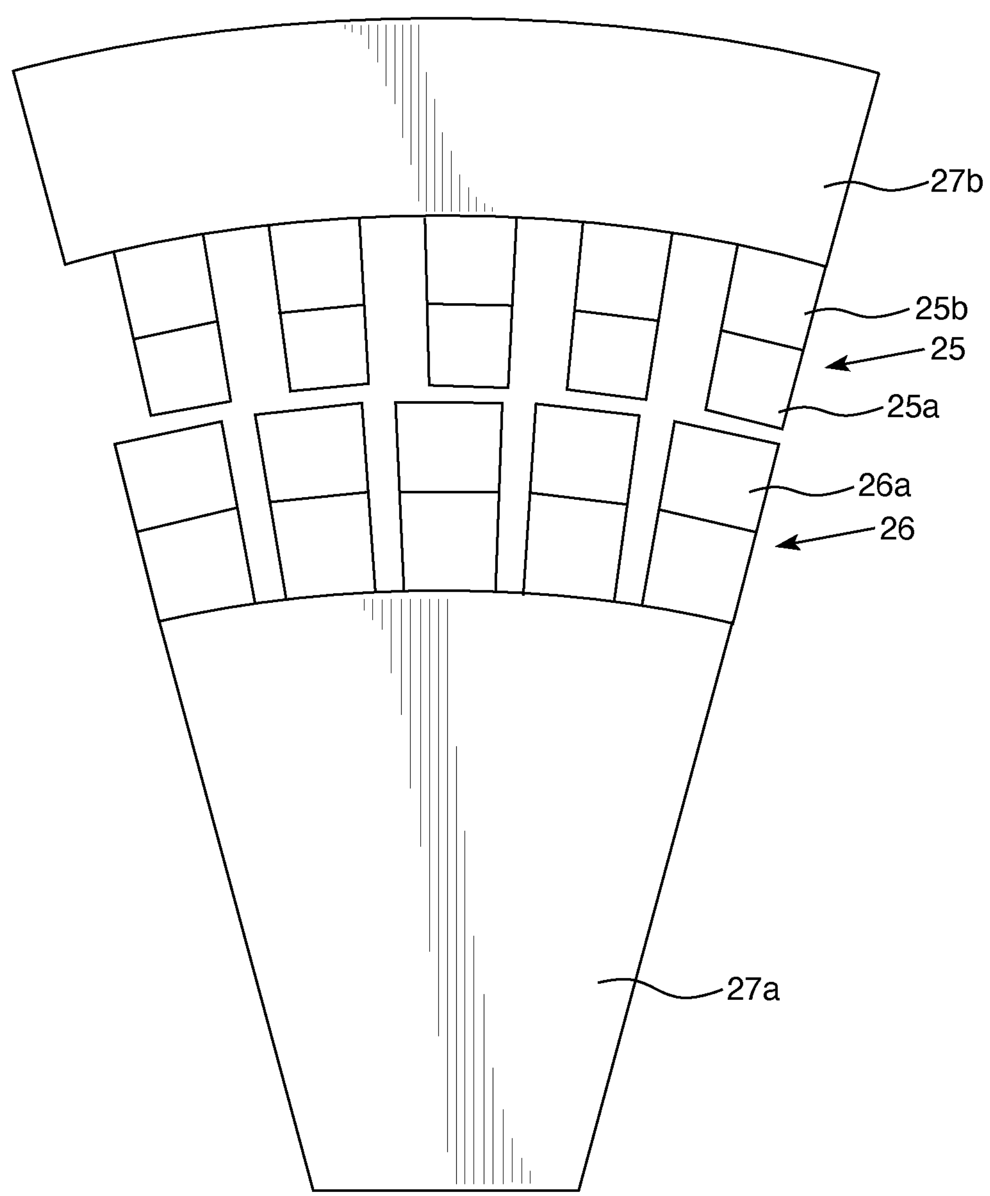
FIG. 4 depicts a detail view of the interfacing stator and rotor elements.

FIG. 4 shows a pair of opposing piezoelectric actuators and their corresponding magnets in detail. Stator piezoelectric actuator 27*b* is affixed to stator magnet 25 which has stator north pole 25*a* and stator south pole 25*b*. Rotor piezoelectric actuator 27*a* is affixed to rotor magnet 26 which has rotor north pole 26*a* and rotor south pole 26*b*. It is preferred, but not required, that the rotor magnets and the stator magnets be asymmetrical to each other (that is, the rotor magnets are not symmetrical with the stator magnets, shown here as their being different sizes) to make it easier to overcome the tendency of the system to "lock" into a position of minimized magnetic potential energy. Since the magnets are not symmetrical, when they are moved in relation to each other the corresponding magnetic fields will tend to push more in one direction than the other, overcoming such locking symmetry.

Figure 5:
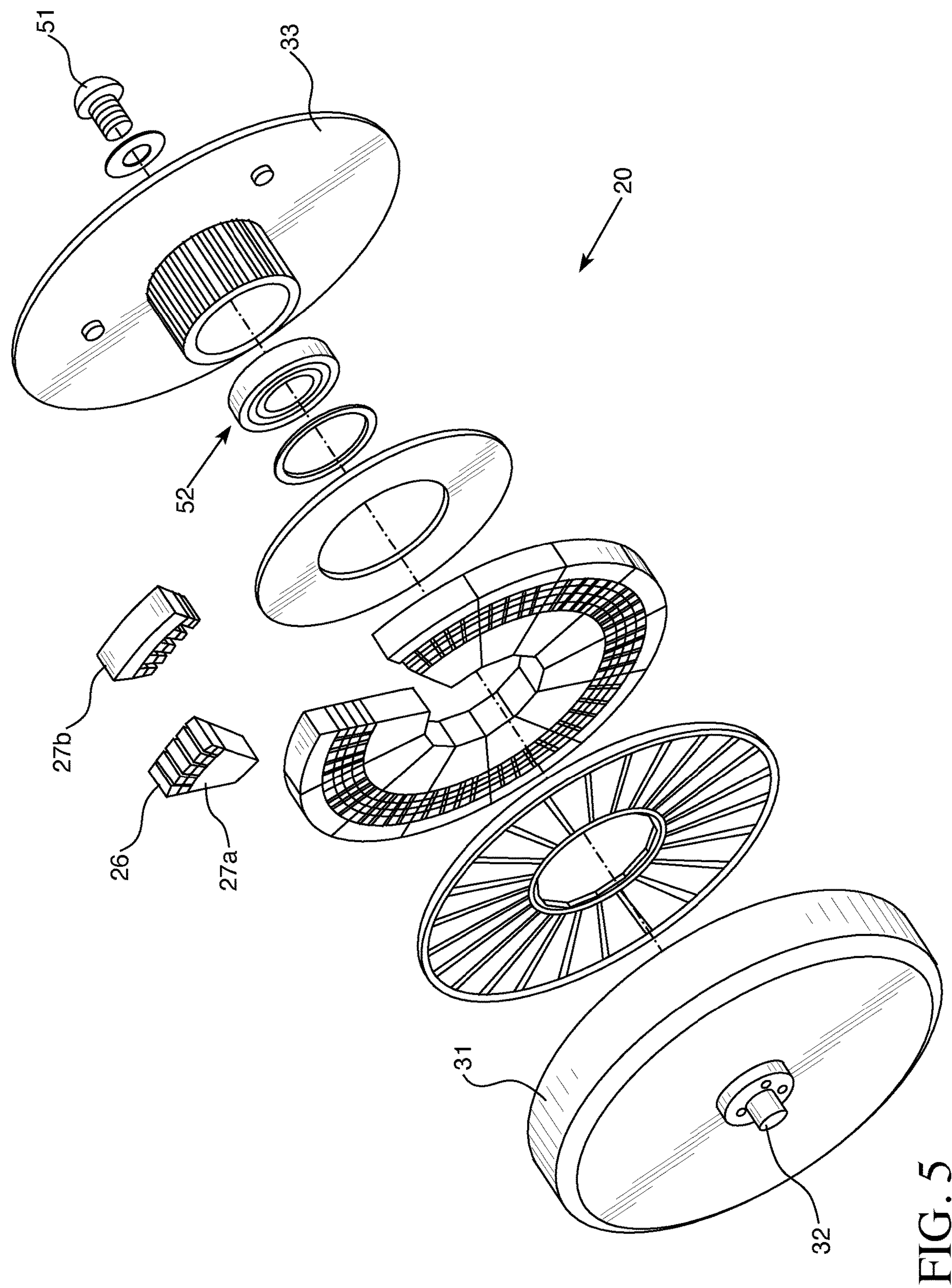
FIG. 5 depicts an exploded perspective view of the first alternate embodiment brushless electric motor assembly.

FIG. 5 shows a more complete assembly of the first alternate embodiment of the invention for clarity of disclosure. Axial bolt 51 holds the assembly together and keeps the rotary elements on-center. Bearing 52 incorporates rotary center bearing element 24, race 22, balls 23, and fixed center bearing element 28. (See FIG. 2 for more detail.)

Figure 6:
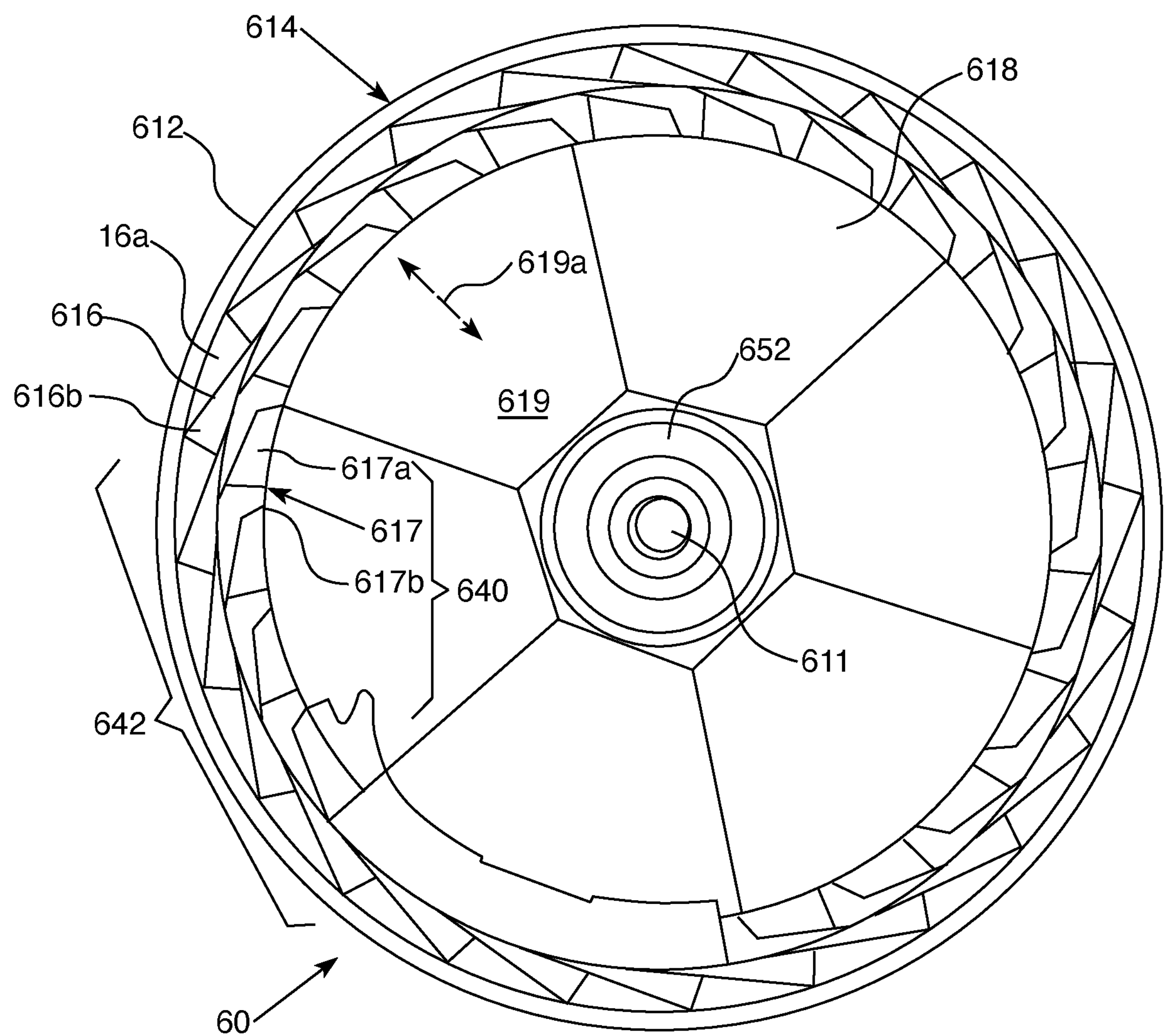
FIG. 6 depicts an overhead view of a second alternate embodiment of the brushless electric motor.

FIG. 6 shows a second alternate embodiment of the brushless electric motor with a more complex configuration of rotor magnets and stator magnets. This configuration, while not required, is somewhat preferred as it provides multiple benefits to the practice of the invention at the price of higher complexity and cost of manufacture.

Brushless electric motor 60 comprises rotor assembly 614 and stator assembly 618. Rotably affixing the rotor assembly to the stator assembly is bearing 652 which rotates around central point 611. Mechanically affixed to bearing 652 are one or more stator piezoelectric elements. Shown is a configuration with six such stator piezoelectric elements including stator piezoelectric element 619. Mechanically affixed to the stator piezoelectric elements are stator magnet elements such as stator magnet element 640. The stator magnet elements comprise one or more magnets having a north pole and a south pole, such as stator magnet 617 having stator magnet north pole 617*a* and stator magnet south pole 617*b*. There is a gap between the stator magnet elements and one or more rotor magnet elements. Shown is a configuration with six such rotor magnet elements including rotor magnet element 642. Each rotor magnet element includes one or more rotor magnets such as rotor magnet 616, which has rotor magnet north pole 616*a* and rotor magnet south pole 616*b*.

To practice the invention, as with prior described embodiments, one or more of the stator piezoelectric actuators, such as stator piezoelectric actuator 619, is energized by a switching power supply (NOT SHOWN) controlled by a frequency controller (NOT SHOWN) such that when, for example, stator piezoelectric actuator 619 is energized, it expands along axis of expansion 619*a*, causing the corresponding stator magnet element to get closer to one or more rotor magnet elements. This produces a change in the orientation of the magnetic fields of the stator and rotor magnetic elements, causing the corresponding stator magnetic element to exert a force on the rotor magnetic element which in turn causes the rotor magnet element to exert a force on the housing 612, causing it, along with the entire rotor assembly 614 to rotate around central point 611 on bearing 652 relative to stator assembly 618. This rotational force is transmitted to an external load via hollow shaft 632 (NOT SHOWN, see FIG. 7.)

It is not required that each rotor magnet element be exactly geometrically opposed to a stator magnet element at any particular time during operation or non-operation and in fact it is likely that the equilibrium during non-operation will result in some degree of offset. It is strongly preferred that there be a rotor magnet element for each stator magnet element, and vice versa. It is required that there be a gap between the rotor magnet elements and the stator magnet elements sufficient to allow the rotor magnet elements to move freely without contacting the stator magnet elements under any reasonable amount of bearing load, rotary speed, or transient vibratory load.

Although the configuration of magnets shown will be inherently stable due to magnetic attraction between the individual magnets, it is preferred that the magnets in each rotor magnet element and stator magnet element be epoxied or otherwise physically affixed to each other to maintain the desired alignment and prevent shifting under load or due to vibration or other transient phenomena.

It is strongly preferred, but not required, to use an overlapping configuration of magnets as shown in the rotor magnet elements and the stator magnet elements as this will minimize asymmetries in the overall magnetic field structure in the brushless magnetic motor.

Figure 7:
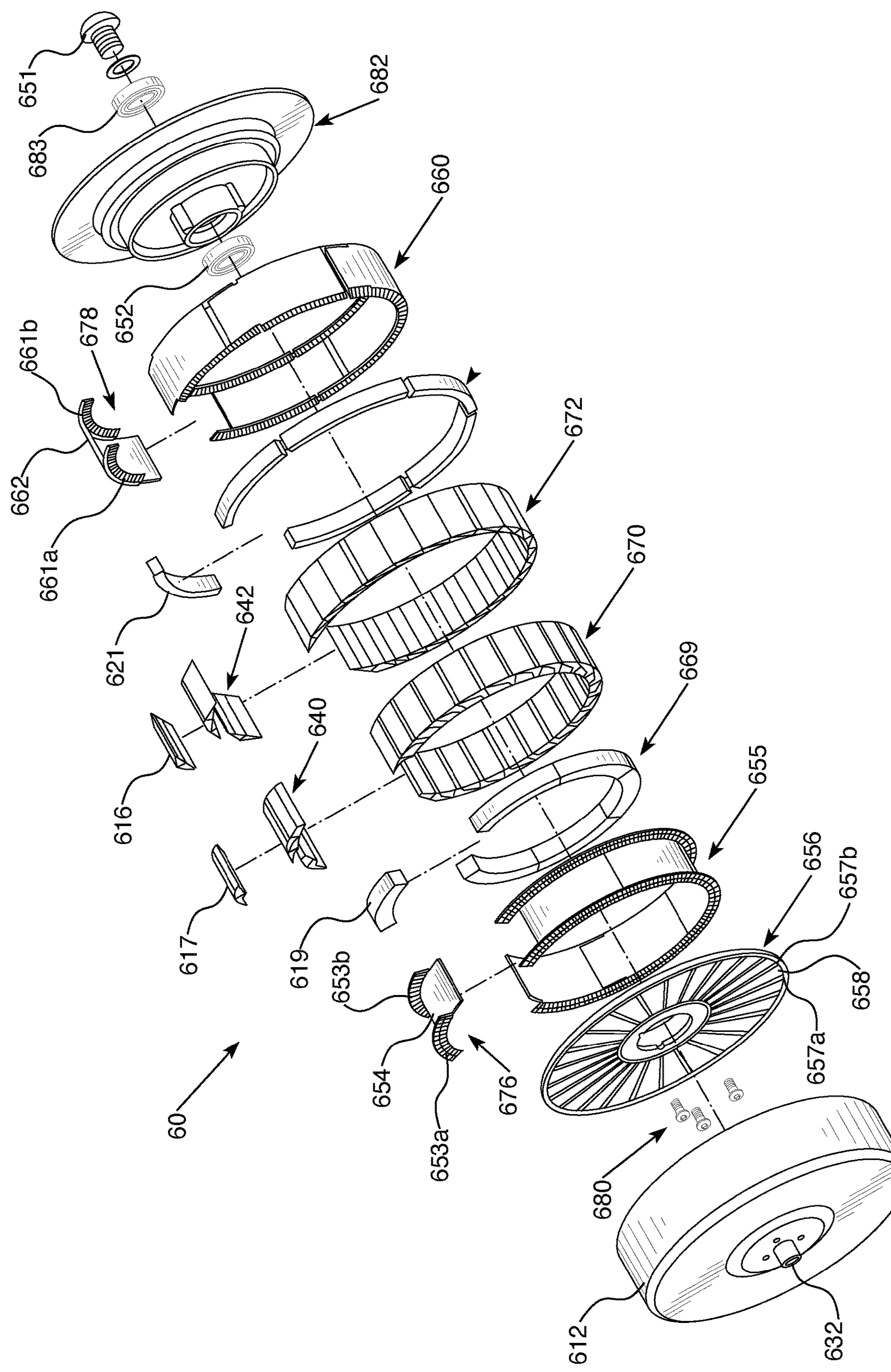
FIG. 7 depicts an exploded perspective view of the second alternate brushless electric motor assembly.

FIG. 7 shows a more complete assembly of the second alternate embodiment of the invention for clarity of disclosure along with the addition of an optional set of stator piezoelectric actuators as in FIG. 2. (See FIG. 6 for more detail.) Axial bolt 651 holds the assembly together and keeps the elements on-center. Capacitor array bolts 680 affix capacitor array 656 to base element 682 by means of threaded receivers 681. Although shown as traditional capacitive plates, any desired means of capacitive induction of current, such as vacuum-tube capacitors, can be used.

For purposes of this description, it is assumed that base element 682 is secured to something which is designated as static and therefore base element 682 forms part of a stator assembly. For example, if motor 60 were to be used to drive the wheel of an electric vehicle, base element 682 would ultimately be statically affixed to the chassis of the vehicle, whereas housing 612 would ultimately be statically affixed to the wheel of the vehicle.

Capacitor array 680, which does not rotate relative to the stator assembly, includes capacitor plates such as capacitor plate 658, each capacitor plate separated by a gap such as capacitor gaps 657*a* and 657*b*. Capacitor array energizes rotor piezoelectric array 674, which includes one or more rotor piezoelectric actuators such as rotor piezoelectric actuator 621. The rotor piezoelectric actuators are mechanically affixed to one or more (optional) rotor magnet brackets 678, each rotor magnet bracket having a rotor circumferential surface 662, and (optional) rotor vertical guides 661*a* and 661*b*, with all of the rotor magnet brackets forming rotor magnet bracket assembly 660. Mechanically affixed to the rotor piezoelectric actuators, either directly or via the (optional) rotor magnet brackets, are one or more rotor magnet elements such as rotor magnet element 642, each rotor magnet element comprising one or more rotor magnets such as rotor magnet 616, with all of the rotor magnet elements forming rotor magnet assembly 672.

When energized, the rotor piezoelectric actuators expand toward the center of motor 60 (since they cannot expand against the fixed position of the rest of the rotor assembly including ultimately housing 612) pushing the rotor magnet elements toward the stator magnet elements (see below) and imparting a magnetic force as explained in previous descriptions (see FIGS. 1, 2, and 6.) This ultimately causes the rotor assembly, including housing 612, to rotate, allowing for rotary force to be exerted through hollow shaft 632. The rotor piezoelectric actuators can be energized one at a time, all together, or in sequence, as is desired and appropriate for the load and conditions. The rotor piezoelectric actuators can be energized without energizing the stator piezoelectric actuators (see below) or in concert with them.

Figure 7A:
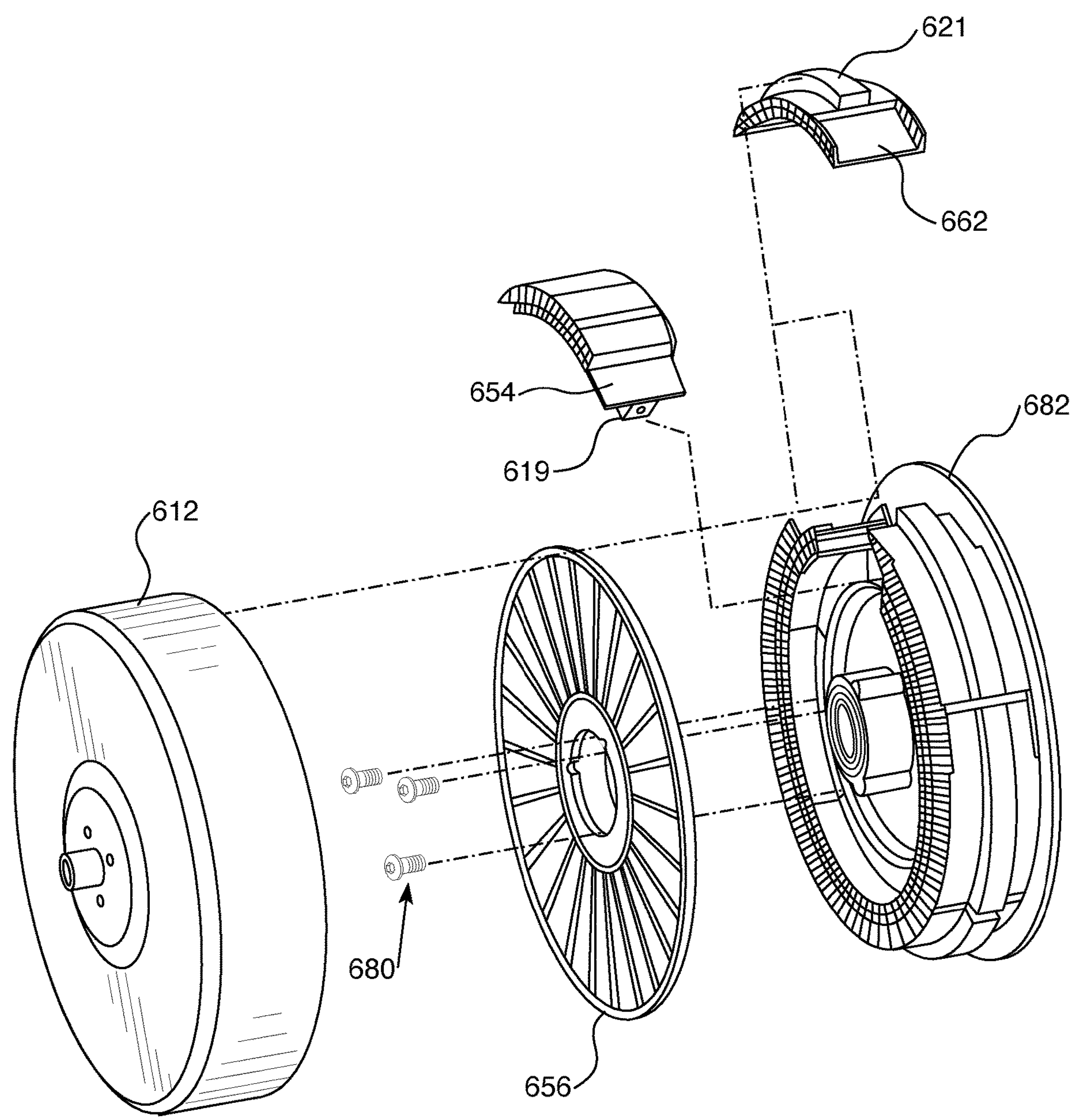
FIG. 7*a* depicts an alternate exploded perspective view of the second alternate brushless electric motor assembly.
Figure 7B:
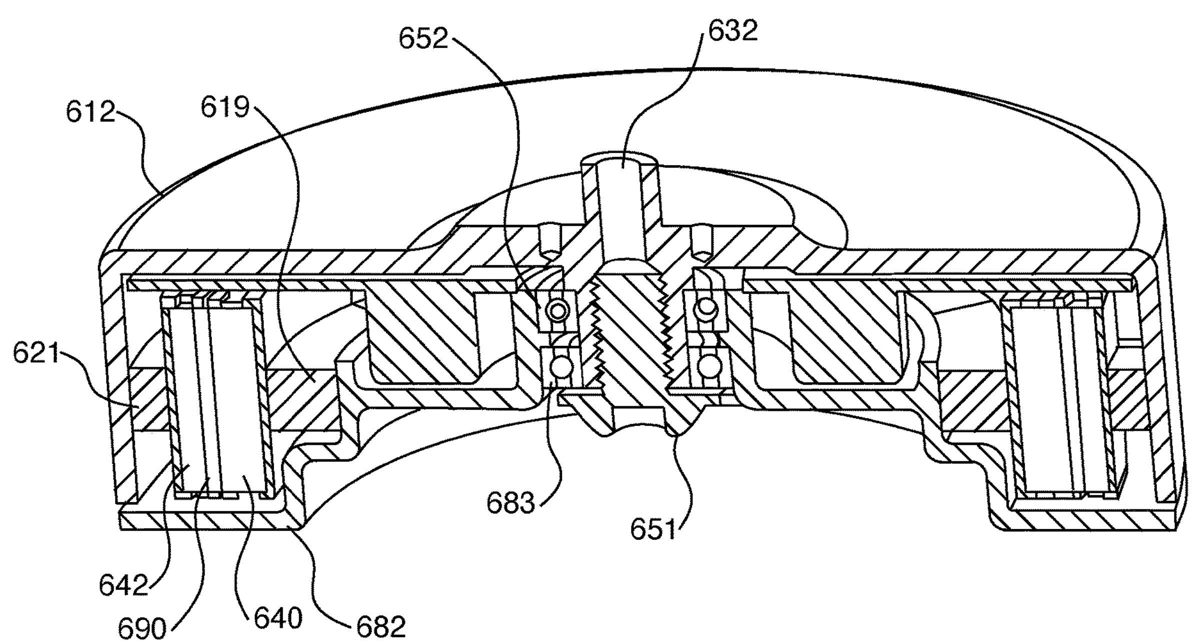
FIG. 7*b* depicts a cutaway view of the second alternate brushless electric motor assembly.

Rotor magnet assembly 672 radially surrounds stator magnet assembly 670, the rotor magnet assembly separated from the stator magnet assembly by a gap (NOT SHOWN, see FIG. 7*b*.) Stator magnet assembly 670 comprises one or more stator magnet elements such as stator magnet element 640, each stator magnet element comprising one or more stator magnets such as stator magnet 617. Stator magnet elements are mechanically affixed to stator piezoelectric assembly 669, which includes one or more stator piezoelectric actuators such as stator piezoelectric actuator 619, either directly or by means of (optional) stator magnet bracket assembly 655. (Optional) stator magnet bracket assembly 655 comprises one or more stator magnet brackets such as stator magnet bracket 676, each stator magnet bracket including a stator circumferential surface such as stator circumferential surface 654 and (optional) stator vertical guides 653*a* and 653*b*.

When energized, the stator piezoelectric actuators expand toward the outer circumference of motor 60 (since they cannot expand toward the fixed position of the rest of the stator assembly) pushing the stator magnet elements toward the rotor magnet elements and imparting a magnetic force as explained in previous descriptions (see FIGS. 1, 2, and 6.) This ultimately causes the rotor assembly, including housing 612, to rotate, allowing for rotary force to be exerted through hollow shaft 632. The stator piezoelectric actuators can be energized one at a time, all together, or in sequence, as is desired and appropriate for the load and conditions. The stator piezoelectric actuators can be energized without energizing the rotor piezoelectric actuators or in concert with them.

FIG. 7*a* shows the configuration of FIG. 7 in an alternate phase of assembly for clarity of disclosure. Housing 612 is ready to be placed over the rest of the motor assembly, with capacitor array 656 ready to be secured to base element 682 with capacitor array bolts 680. The rotor and stator elements are assembled, for example rotor piezoelectric actuator affixed to rotor circumferential surface 662 and stator piezoelectric actuator affixed to stator circumferential surface 654, and both ready to be inserted into their respective assemblies.

FIG. 7*b* shows the configuration of FIG. 7 in a cutaway view for clarity of disclosure. Housing 612 is axially secured by axial bolt 651 but is free to rotate relative to base element 682 as they are mechanically connected only by bearings 652 and 683. Rotor magnet element 642 is separated from stator magnet element 640 by gap 690. The size of gap 690 can be changed by energizing stator piezoelectric actuator 619 and/or rotor piezoelectric actuator 621. As the piezoelectric actuators change the size of gap 690, the relative orientation of the magnetic fields of the rotor magnet elements and the stator magnet elements will change. This will cause magnetic force to be exerted between magnet elements, but as only the rotor magnet elements (ultimately connected to housing 612) can move, the force will cause housing 612 to move, allowing rotary motion to be imparted to hollow shaft 632 and thus to an axle, a wheel, or any other rotary member or rotary load desired.

Figure 8:
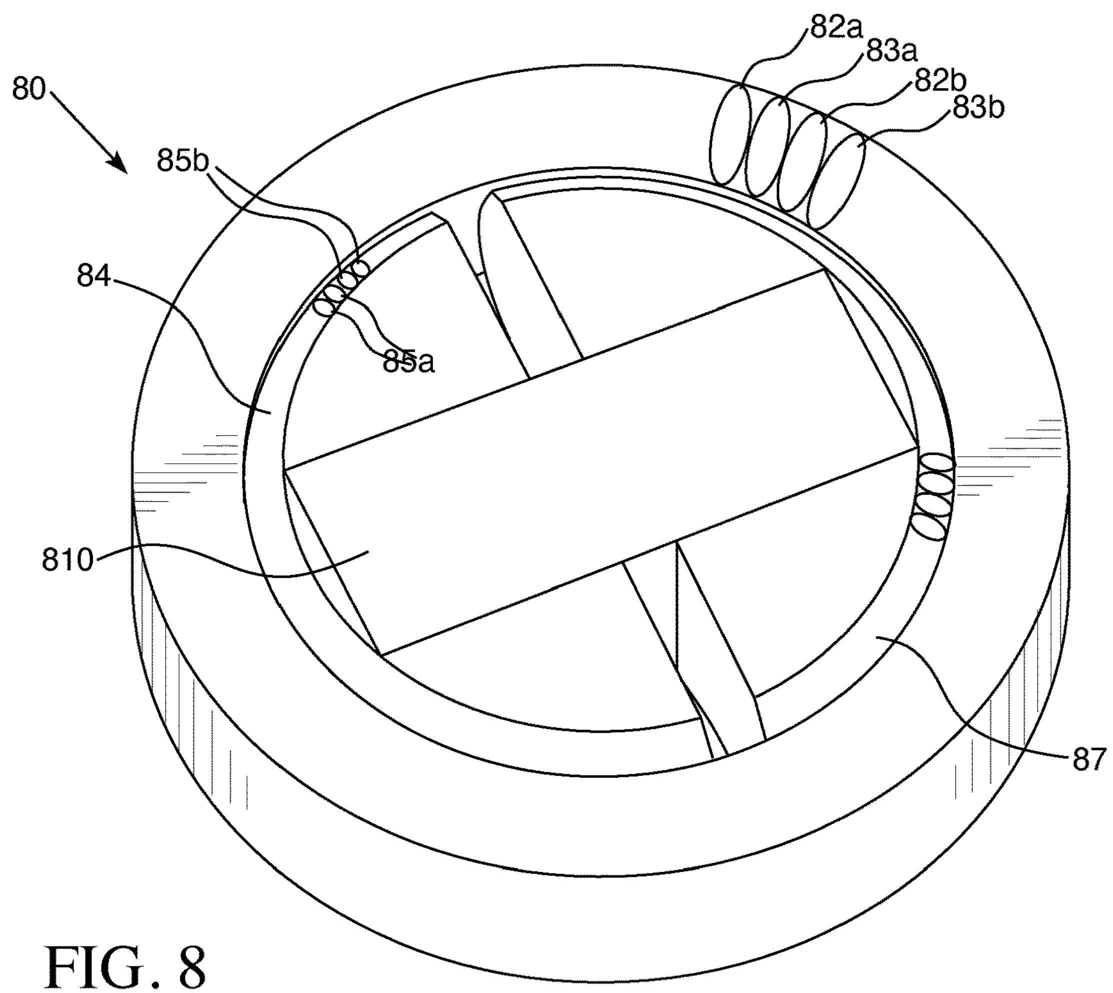
FIG. 8 depicts a perspective view of a third alternate embodiment of the brushless electric motor.

FIG. 8 shows a third alternate embodiment of the invention. In this embodiment, rather than a plurality of distinctive magnets, the rotor magnets comprise a single piece of rotor magnetic material, which is structured to have a plurality of magnetic regions, each magnetic region having a north pole and a south pole. Similarly, there are two individual pieces of stator magnetic material having a plurality of magnetic regions. Each piece of stator magnetic material is attached to one end of a single piezoelectric actuator.

Brushless electric motor 80 comprises rotor assembly 81, stator magnet assemblies 84 and 87, and piezoelectric actuator 810 which is operably affixed to PCB 92 (NOT SHOWN: See FIG. 9.) Rotor assembly 82, which is free to rotate relative to all stator assembly components and is attached to whatever rotational load (NOT SHOWN) it is desired to accelerate with the motor, is comprised of magnetic material (or can have an inner section of magnetic material surrounded by non-magnetic material as desired) which has magnetic regions, each magnetic region having a north pole and a south pole such as rotor north poles 82*a* and 82*b* and rotor south poles 83*a* and 83*b*. Opposite the rotor assembly's magnetic material, separated by a gap (See FIG. 9,) are stator magnet assemblies 84 and 87. It is possible to construct this embodiment of the invention with a single stator magnet assembly, but it is strongly preferred to use two symmetrical stator magnet assemblies as shown for purposes of balance and to maximize the piezoelectric actuator's efficiency. First stator magnet assembly 84, similarly to rotor section 82, is composed in whole or in part of magnetic material, which has multiple magnetic regions, each magnetic region having a north pole such as stator north poles 85*a* and 85*b* and rotor south poles 86*a* and 86*b*. Second stator magnet assembly 87, is likewise composed in whole or in part of magnetic material, which has multiple magnetic regions, each magnetic region having a north pole such as stator north poles 88*a* and 88*b* and stator south poles 89*a* and 89*b*.

Figure 9:
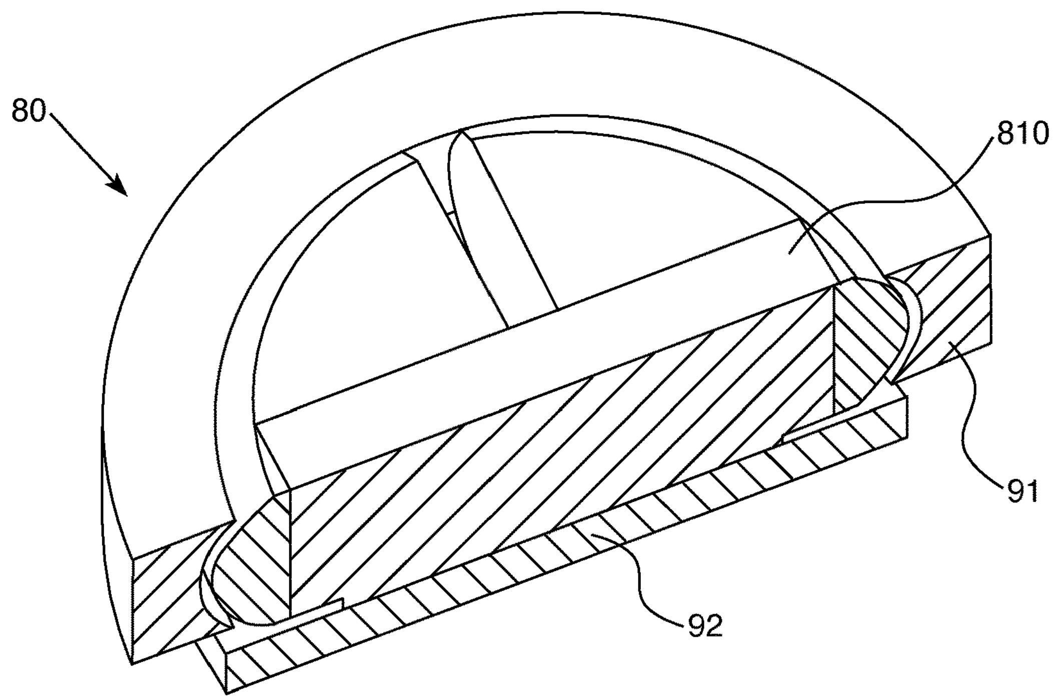
FIG. 9 depicts a cross-sectional perspective view of the third alternate embodiment of the brushless electric motor.

FIG. 9 shows a cutaway view of the third alternate embodiment of the invention for additional clarity of disclosure. Brushless electric motor 80 has gap 91, which separates the various motor assemblies (see FIG. 8) and allows the motor to also serve as a no-contact magnetic bearing so long as the planar load does not materially affect the gap as maintained by the magnetic fields of the rotor magnet assembly and the stator magnet assemblies. This is an additional advantage of several of the embodiments and configurations of the invention disclosed herein. PCB 92 is a printed circuit board which is both mechanically and electrically affixed to piezoelectric actuator 810 and provides it with electrical potential from a switching power supply (NOT SHOWN.)

If necessary, fluid can be forcibly circulated around the assemblies or even through the gap to cool the motor, but as many piezoelectric devices actually work better when they reach a relatively high operating temperature, the need for cooling will be minimal in many applications. This is another advantage of the invention. It is required that for all embodiments and configurations of the invention, that operating temperatures be kept low enough to avoid demagnetization of any permanent magnets which are used. This will vary as various kinds of magnetic material have different demagnetization thresholds. (For example, some ferrite magnets can tolerate temperatures up to 250° C., whereas some rare-earth magnets can only tolerate temperatures up to 100° C.)

To practice this embodiment of the invention, an electrical potential is put across piezoelectric actuator 810, which is electrically connected to PCB 92. This causes piezoelectric actuator 810 to expand along its long axis, changing the relative position of the stator magnet assemblies and the rotor assembly. This in turn causes electromagnetic force to be exerted on the rotor assembly, which will rotate to a position which will minimize the magnetic potential energy between the rotor assembly and the stator assemblies. The electrical potential across piezoelectric actuator 810, is then removed and/or reversed, causing it to contract along its long axis, again changing the relative position of the various magnet assemblies, and imparting more rotational energy to the rotor assembly. A switching power supply (NOT SHOWN) continuously cycles the electrical potential across the piezoelectric actuator to produce the desired rotational energy as in earlier described embodiments.

It is optional, but neither preferred nor required, for either the rotor assembly or the stator assembly, or both, to comprise multiple magnets as in earlier described configurations. (See FIG. 1, FIG. 2, and/or FIG. 6.) So long as the rotor assembly and the stator assembly are configured as shown, the configuration of this third alternate embodiment incorporating a single piezoelectric actuator will function and provide the benefits of the invention.

Alternate configurations of the invention, which can be applied to any of the described embodiments, will now be disclosed.

In a first alternate configuration of the invention (NOT SHOWN) some or all of the rotor magnets, or some or all of the stator magnets, of either the preferred embodiment or the first alternate embodiment are replaced with electromagnets.

Figure 10:
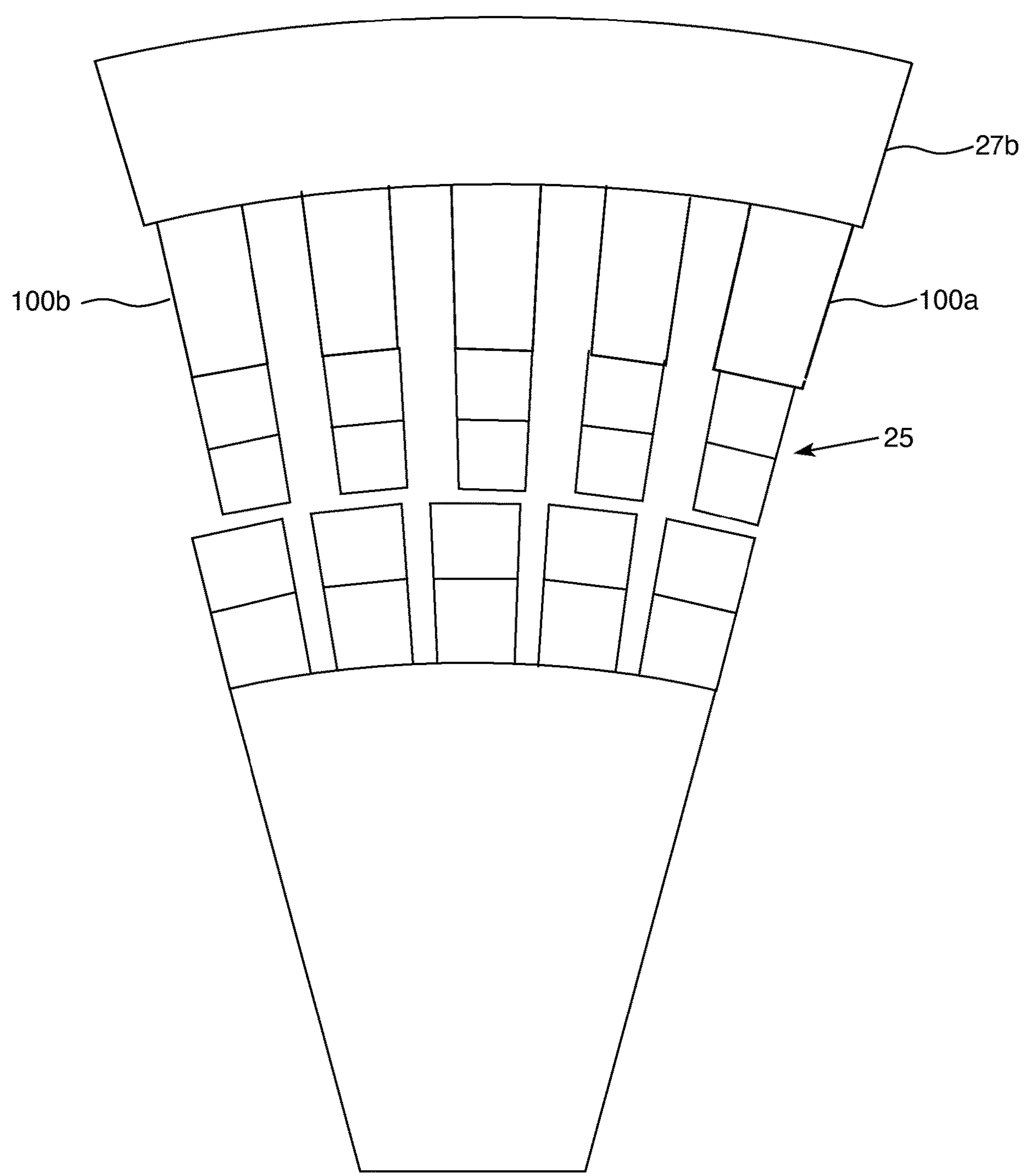
FIG. 10 depicts a detail view of the interfacing stator and rotor elements with the addition of elastic members.

In a second alternate configuration of the invention shown in FIG. 10, one or more elastic members is fitted into the motor assembly such that the piezoelectric actuators are working against the elastic members when they are energized, compressing them and creating elastic potential energy, so that when the piezoelectric actuator(s) is/are de-energized, the magnet(s) affixed to the piezoelectric actuator(s) return to their prior position more quickly and without the need to impose a reverse polarity potential across the piezoelectric actuator when the elastic potential energy provides impetus to the piezoelectric actuators. A group of elastic members including first elastic member 100*a* and second elastic member 100*b* are placed between the stator piezoelectric actuator 27*b* and the stator magnets, as seen by first elastic member 100*a* between stator piezoelectric actuator 27 and stator magnet 25. Elastic members can be placed in any position in the motor where they would provide the appropriate storage of potential energy, both as shown, on the rotor magnets, or as suits the application of the invention.

In a third alternate configuration of the invention (NOT SHOWN) the features of the first and second configurations are combined.

It will be apparent to those of ordinary skill in the art that while the invention and its preferred embodiments are described in terms of rotary motors, the principles taught by the invention can be used to create linear motors, such as reciprocating motors, by using the basic principle of piezoelectric motivation of opposing magnetic elements to create a linear force instead of a centripetal force. Thus, the claims below include both rotary configurations and linear configurations where and as appropriate.

While various embodiments and configurations of the present invention have been described above, it should be understood that they have been presented by way of example only, and not limitation. Thus, the breadth and scope of the present invention should not be limited by any of the above exemplary embodiments.

This application—taken as a whole with the abstract, specification, and drawings being combined—provides sufficient information for a person having ordinary skill in the art to practice the invention as disclosed herein. Any measures necessary to practice this invention are well within the skill of a person having ordinary skill in this art after that person has made a careful study of this disclosure.

Because of this disclosure and solely because of this disclosure, modification of this device and method can become clear to a person having ordinary skill in this particular art. Such modifications are clearly covered by this disclosure.

What is claimed and sought to be protected by Letters Patent is:

1. A brushless electric motor comprising:

a) A group of piezoelectric actuators, the group of piezoelectric actuators comprising at least one piezoelectric actuator, all of the piezoelectric actuators electrically connected to a power supply;

b) A group of actuator magnets, the group of actuator magnets comprising at least one actuator magnet, each of the at least one piezoelectric actuators mechanically affixed to the group of actuator magnets;

c) A group of response magnets, the group of response magnets physically opposed to the first plurality of piezoelectric elements separated by a variable gap having a size, such that when one or more of the plurality of piezoelectric actuators are energized by the power supply, the size of the variable gap changes;

d) A motor assembly including a mobile assembly and a static assembly, the mobile assembly mechanically affixed to either the group of actuator magnets or the group of response magnets, the static assembly mechanically affixed to whichever of the group of actuator magnets or the group of response magnets the mobile assembly is not mechanically affixed, such that when the size of the variable gap changes, a magnetic force is exerted on the mobile assembly, causing the mobile assembly to move relative to the static assembly; and, e) A group of actuator capacitor plates, the group of actuator capacitor plates comprising at least one actuator capacitor plate, the group of actuator capacitor plates connected to the power supply and mechanically affixed to a housing of the brushless electric motor such that when the group of capacitor plates are energized by the power supply, they form a capacitor circuit with one or more of the piezoelectric actuators, causing a current to be induced in the piezoelectric actuators in the capacitor circuit.

2. The brushless electric motor of claim 1, wherein the group of piezoelectric actuators further comprises:

f) a first group of piezoelectric actuators forming a group of stator piezoelectric actuators, each of the stator piezoelectric actuators mechanically affixed to a stator magnet; and, g) a second group of piezoelectric actuators forming a group of rotor piezoelectric actuators, each of the rotor piezoelectric actuators mechanically affixed to a rotor magnet.

3. The brushless electric motor of claim 1, wherein each group of actuator magnets has two ends, and wherein the actuator magnets in each group of actuator magnets overlap each other to produce a combined actuator magnetic field, and wherein each of the actuator magnets in a group of actuator magnets has a north pole and a south pole, and the south pole of any particular actuator magnet is either physically proximate to one of the two ends, or to the north pole of another actuator magnet in the group of actuator magnets, and the north pole of any particular actuator magnet is either physically proximate to one of the two ends, or to the south pole of another actuator magnet in the group of actuator magnets.

4. The brushless electric motor of claim 3, wherein the actuator magnets in each group of actuator magnets are secured by an adhesive, the adhesive securing the actuator magnets in a fixed orientation.

5. A brushless electric motor as in claim 1, further comprising:

e) A group of elastic members, the elastic members mechanically affixed to at least one piezoelectric actuator such that when the piezoelectric actuator is energized, the elastic member will acquire an elastic potential energy, and when the piezoelectric actuator is de-energized, the elastic potential energy will be converted into an elastic force which will push against the piezoelectric actuator.

6. A brushless electric motor as in claim 2, further comprising:

e) A group of elastic members, the elastic members mechanically affixed to at least one piezoelectric actuator such that when the piezoelectric actuator is energized, the elastic member will acquire an elastic potential energy, and when the piezoelectric actuator is de-energized, the elastic potential energy will be converted into an elastic force which will push against the piezoelectric actuator.

7. A brushless electric motor as in claim 3, further comprising:

f) A group of elastic members, the elastic members mechanically affixed to at least one piezoelectric actuator such that when the piezoelectric actuator is energized, the elastic member will acquire an elastic potential energy, and when the piezoelectric actuator is de-energized, the elastic potential energy will be converted into an elastic force which will push against the piezoelectric actuator.

8. A brushless electric motor as in claim 4, further comprising:

e) A group of elastic members, the elastic members mechanically affixed to at least one piezoelectric actuator such that when the piezoelectric actuator is energized, the elastic member will acquire an elastic potential energy, and when the piezoelectric actuator is de-energized, the elastic potential energy will be converted into an elastic force which will push against the piezoelectric actuator.

9. A brushless electric motor comprising:

a) At least one group of static piezoelectric actuators, the at least one group of static piezoelectric actuators comprising at least one static piezoelectric actuator, all of the static piezoelectric actuators electrically connected to a power supply;

b) A group of static magnets, the group of static magnets comprising at least one static magnet, each of the at least one static piezoelectric actuators mechanically affixed to the group of static magnets;

c) At least one group of mobile piezoelectric actuators, the at least one group of mobile piezoelectric actuators comprising at least one mobile piezoelectric actuator, all of the mobile piezoelectric actuators electrically connected to the power supply;

d) A group of mobile magnets, the group of mobile magnets comprising at least one mobile magnet, each of the at least one mobile piezoelectric actuators mechanically affixed to the group of mobile magnets;

e) A motor assembly having a mobile assembly and a static assembly, the mobile assembly mechanically affixed to the group of mobile piezoelectric actuators, the static assembly mechanically affixed to the group of static piezoelectric actuators, such that there is a variable gap having a size between the group of mobile magnets and the group of static magnets and when the size of the variable gap changes, a magnetic force is exerted on the mobile assembly, causing the mobile assembly to move relative to the static assembly.

10. The brushless electric motor of claim 9, further comprising:

f) A group of elastic members, the elastic members mechanically affixed to at least one of the static or mobile piezoelectric actuator such that when the piezoelectric actuator is energized, the elastic member will acquire an elastic potential energy, and when the piezoelectric actuator is de-energized, the elastic potential energy will be converted into an elastic force which will push against the piezoelectric actuator.

11. The brushless electric motor of claim 9, further comprising:

f) A group of energizer capacitor plates, the group of energizer capacitor plates comprising at least one energizer capacitor plate, the group of actuator capacitor plates connected to the power supply and mechanically affixed to a housing of the brushless electric motor such that when the group of capacitor plates are energized by the power supply, they form a capacitor circuit with one or more of the piezoelectric actuators, causing a current to be induced in the piezoelectric actuators in the capacitor circuit.

12. The brushless electric motor of claim 9, wherein each group of static magnets and/or each group of mobile magnets is a group of magnets containing at least two magnets, and wherein each group of magnets has two ends, and wherein the magnets in each group of magnets overlap each other to produce a combined magnetic field, and wherein each of the magnets in a group of magnets has a north pole and a south pole, and the south pole of any particular magnet is either physically proximate to one of the two ends, or to the north pole of another magnet in the same group of magnets, and the north pole of any particular magnet is either physically proximate to one of the two ends, or to the south pole of another magnet in the same group of magnets.

13. The brushless electric motor of claim 1, wherein the piezoelectric actuators are electrically connected to the power supply with a capacitive connection, such that at least one of the piezoelectric actuators form a first terminal of a capacitor, and a capacitive surface electrically connected to the power supply forms a second terminal of the capacitor, the capacitive surface separated from at least one piezoelectric actuator by a gap, such that when the second capacitive surface is energized by the power supply, a current is induced in at least one piezoelectric actuator, energizing at least one piezoelectric actuator.

14. The brushless electric motor of claim 9, wherein the piezoelectric actuators are electrically connected to the power supply with a capacitive connection, such that a first capacitive surface electrically connected to at least one of the piezoelectric actuators forms a first terminal of a capacitor, and a second capacitive surface electrically connected to the power supply forms a second terminal of the capacitor, the first and second terminals separated by a gap, such that when the second capacitive surface is energized by the power supply, a current is induced in the first capacitive surface, energizing at least one piezoelectric actuator.

* * * * *